United States Patent [19]
Furukawa

[11] Patent Number: 5,642,070
[45] Date of Patent: Jun. 24, 1997

[54] SIGNAL PROCESSING CIRCUIT AND SYSTEM FOR DETECTION OF ABSOLUTE VALUE

[75] Inventor: Tatsuo Furukawa, Atsugi, Japan

[73] Assignee: Canon Kabushiki Kaisha, Tokyo, Japan

[21] Appl. No.: 332,502

[22] Filed: Oct. 31, 1994

Related U.S. Application Data

[63] Continuation of Ser. No. 904,561, Jun. 26, 1992, abandoned.

[30] Foreign Application Priority Data

Jun. 27, 1991 [JP] Japan ................... 3-156871

[51] Int. Cl.$^6$ ................................ G06G 7/25
[52] U.S. Cl. ............................ 327/354; 327/307
[58] Field of Search ................ 328/26; 307/261, 307/490, 491, 494; 327/354, 58, 62, 104, 184, 303, 531, 307; 363/127

[56] References Cited

U.S. PATENT DOCUMENTS

| | | | |
|---|---|---|---|
| 3,585,487 | 6/1971 | McNally | 328/26 |
| 3,588,671 | 6/1971 | Deboo et al. | 328/26 |
| 3,911,291 | 10/1975 | Rossell | 307/494 |
| 4,459,488 | 7/1984 | Uzawa et al. | 250/578 |
| 4,495,428 | 1/1985 | Ishigaki | 328/26 |
| 4,574,202 | 3/1986 | Ogawa | 307/261 |
| 4,642,681 | 2/1987 | Ikeda | 358/79 |
| 4,751,559 | 6/1988 | Sugawa et al. | 357/30 |
| 4,820,997 | 4/1989 | Sano et al. | 330/252 |

FOREIGN PATENT DOCUMENTS

| | | |
|---|---|---|
| 0351719 | 1/1990 | European Pat. Off. . |
| 2928841 | 1/1980 | Germany . |
| 56-50468 | 5/1981 | Japan . |
| 59-116878 | 7/1984 | Japan . |
| 61-053809 | 3/1986 | Japan . |
| 62-117085 | 5/1987 | Japan . |
| 2079608 | 3/1990 | Japan . |

*Primary Examiner*—Toan Tran
*Attorney, Agent, or Firm*—Fitzpatrick, Cella, Harper & Scinto

[57] ABSTRACT

A signal processing circuit comprises a structure wherein emitters of a plurality of transistors are commonly connected, an inverting amplifier is connected to a base of each of the plurality of transistors, and an absolute value of an input signal supplied to the inverting amplifier is detected. The signal processing circuit has a compensating circuit to compensate a fluctuation of a voltage due to the plurality of transistors.

6 Claims, 7 Drawing Sheets

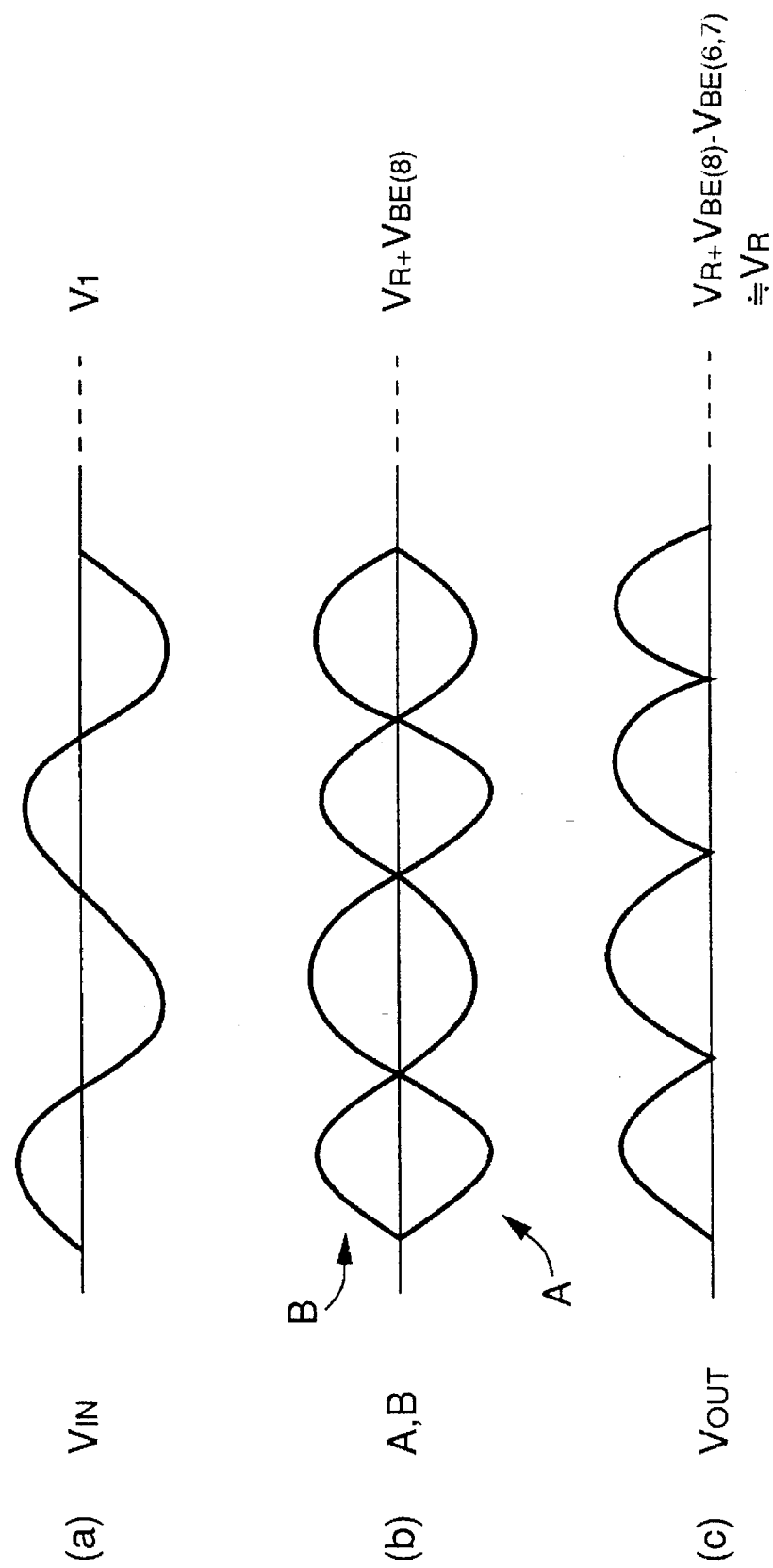

SIGNAL PROCESSING CIRCUIT AND SYSTEM FOR DETECTION OF ABSOLUTE VALUE

This application is a continuation of application Ser. No. 07/904,561 filed Jun. 26, 1992, now abandoned.

BACKGROUND OF THE INVENTION

1. Field of the Invention

The invention relates to an absolute value detecting circuit and a system for detecting an amplitude value of a certain signal, namely, an absolute value of the signal for a predetermined potential and, more particularly, to a signal processing circuit and a system for detection of an absolute value each of which is constructed by combining an emitter coupling circuit of a transistor and an inverting amplifier.

2. Related Background Art

In the electric and electronic fields, in the case where an input signal has amplitudes in both of the positive and negative directions in terms of a voltage for a predetermined voltage level (reference voltage level) (in the case where it has amplitudes in an AC manner), a circuit to detect a difference between the level of the input signal and the reference voltage level is called an absolute value detecting circuit. As a construction of such an absolute value detecting circuit, for instance, there is a construction as shown in FIG. 1. In FIG. 1, reference numeral 18 denotes a voltage clamp circuit to fix an operating voltage level in the circuit to a proper voltage value irrespective of the voltage level of an AC input signal which is supplied from $V_{IN}$. Reference numerals 11 and 12 denote inverting amplifiers each of which comprises a resistor R, a reference voltage $V_R$, and an operational amplifier and 16 indicates an absolute value detecting circuit comprising an emitter coupling circuit of NPN transistors 13 and 14 and a constant current circuit 15.

Generally, in the case where a signal voltage which is applied to the input $V_{IN}$ is an AC input signal at various levels, a method of first passing the AC input signal through the clamp circuit in order to set the AC input signal to a signal so as to have an amplitude with a predetermined voltage as a reference. After the AC input signal was adjusted to a proper operating level by the clamp circuit, it passes through a signal processing circuit for detection of the absolute value which is constructed by the inverting amplifier and the emitter coupling circuit and is generated from an output terminal $V_{out}$. FIG. 2 shows a voltage level at each point in the circuit of FIG. 1. In FIG. 2, a voltage level $V_t$ of $V_{IN}$ is an arbitrary voltage and it is assumed that the voltage level $V_1$ can have any value in accordance with a state of an original input signal (a). The potential of $V_t$ is fixed to a proper level by the subsequent clamp circuit and sent to the inverting amplifier. In the circuit of FIG. 1, although a gain of the inverting amplifier is set to an equal magnification ratio as shown in FIG. 2, such a gain can be arbitrarily set. Now, assuming that an output point at which the signal has passed through the inverting amplifier once is set to A and an output point at which the signal has passed through the inverting amplifier twice is set to B, output waveforms at A and B points are as shown in (b) in FIG. 2. Although output amplitudes can be set to any values in accordance with the gain of the inverting amplifier, all of the output voltage levels are fixed to the reference voltage $V_R$.

After that, a waveform appearing at the final output terminal $V_{out}$ by passing the signal through the absolute value detecting circuit 16 which couples the emitters of the NPN transistors is as shown in (c) in FIG. 2. The voltage level of the output in this instance is generated as levels, that is, $V_R-V_{BE(13,14)}$ which are lower than $V_R$ by only the values of base-emitter voltages $V_{BE(13)}$ and $V_{BE(14)}$ of the NPN transistors 13 and 14 for $V_R$.

FIG. 3 is a circuit diagram of each of the inverting amplifiers 11 and 12 in FIG. 1.

As results of many experiments executed repeatedly by the inventors of the present invention, however, it has been found out that a difference occurs between the output voltage of the inverting amplifier and the output voltage of the absolute value detecting circuit in the above conventional apparatus. Practically speaking, there occurs a phenomenon such that the operating point (operating voltage) is shifted to lower values by only the base-emitter voltages $V_{BE(13)}$ and $V_{BE(14)}$ of the NPN transistors 13 and 14.

Hitherto, since such a circuit has been examined from only a viewpoint of the AC operation, it is considered that the above problem cannot be found out.

The present inventors have found out the above problem when they tried to apply such a circuit to a circuit which handles the voltage level of the output signal in a DC manner.

That is, in the circuit which handles the output voltage level in a DC manner, there is a possibility of the occurrence of inconveniences such as fluctuation of the operating point and decrease in dynamic range. It is considered that the voltages $V_{BE(13)}$ and $V_{BE(14)}$ change in dependence on a value of current I flowing in the constant current circuit 15 and differences of the characteristics of respective transistors. For instance, when such a circuit is intended to be realized by a semiconductor integrated circuit, this results in a cause of occurrence of a large fluctuation in the output voltage level due to a variation in sizes of transistors, a variation in resistance values, differences of the temperature characteristics of the respective devices, and the like.

SUMMARY OF THE INVENTION

The invention is made in consideration of the foregoing technical subjects and it is a main object of the invention to provide a signal processing circuit and a system in which a decrease in voltage level of an output for detection of an absolute value is smaller than that in the conventional circuit.

Another object of the invention is to provide a signal processing circuit and a system in which a fluctuation of the operating point is small.

The above objects of the invention is accomplished by a signal processing circuit and a system in which emitters as main electrode regions of a plurality of transistors are commonly connected, an inverting amplifier is connected to a base as a control electrode region of each of the plurality of transistors, and the absolute value of an input signal supplied to the inverting amplifier is detected, wherein the signal processing circuit has a compensating circuit to compensate a fluctuation of a voltage due to the plurality of transistors.

Still another object of the invention is to provide a signal processing system in which a signal processing circuit in which a main electrode region of a first transistor and a main electrode region of a second transistor are commonly connected and the control electrode region of each of the first and second transistors and an inverting amplifier are connected is provided with a compensating circuit to compensate the voltage corresponding to the voltage between the control electrode region and the main electrode region of each of the first and second transistors.

According to the invention, since an input offset voltage is preset by the compensating circuit provided for the signal processing circuit for detection of the absolute value, the reduction of the output voltage level in the absolute value detecting circuit can be cancelled by the input offset voltage as a voltage which is equivalent to $V_{BE(13)}$ and $V_{BE(14)}$. According to the present invention, accordingly, it is possible to prevent inconveniences such as fluctuation of the operating point occurring due to a variation of the devices, a characteristic change relating to the temperature change, or the like and a degrading in dynamic range.

BRIEF DESCRIPTION OF THE DRAWINGS

FIG. 5 is a diagram showing a signal waveform at each point in FIGS. 4A and 4B;

DETAILED DESCRIPTION OF THE PREFERRED EMBODIMENTS

Preferred embodiments of the invention will be described hereinbelow. However, the invention is not limited to those embodiments but can be applied to any other modifications which can accomplish the objects of the invention.

Although the invention has a large effect in the case of handling the signal in a DC manner, it has a similar effect even in the case of handling the signal in an AC manner. The reliability of the circuit is high in any of the above cases.
(Embodiment 1)

Figure 1:
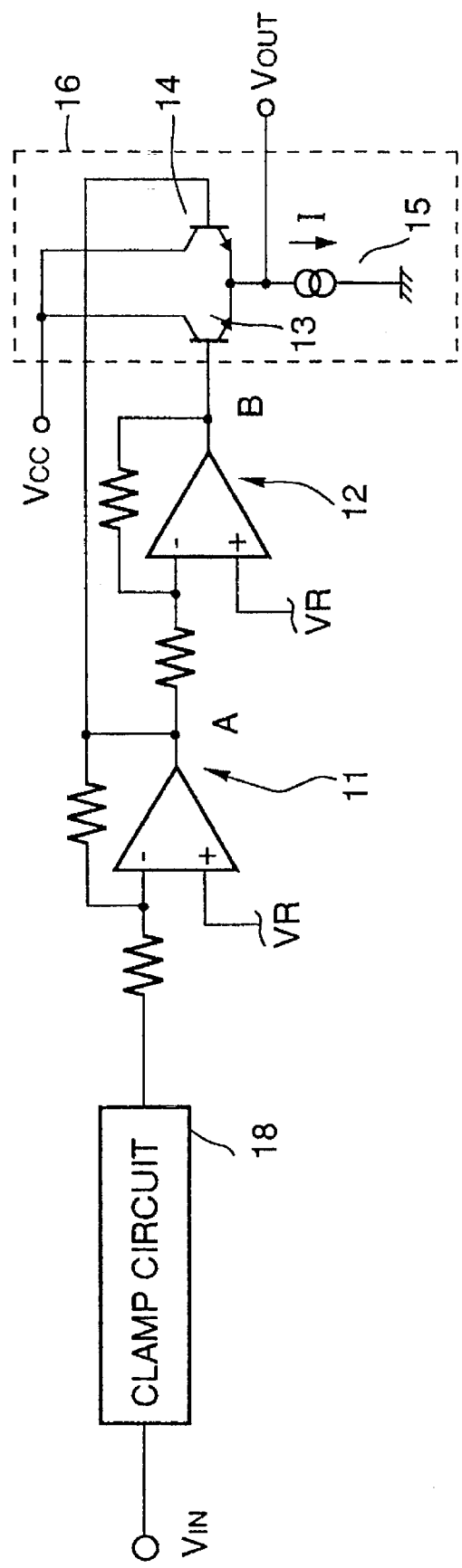
FIG. 1 is a circuit diagram of a conventional signal processing circuit.
Figure 2:
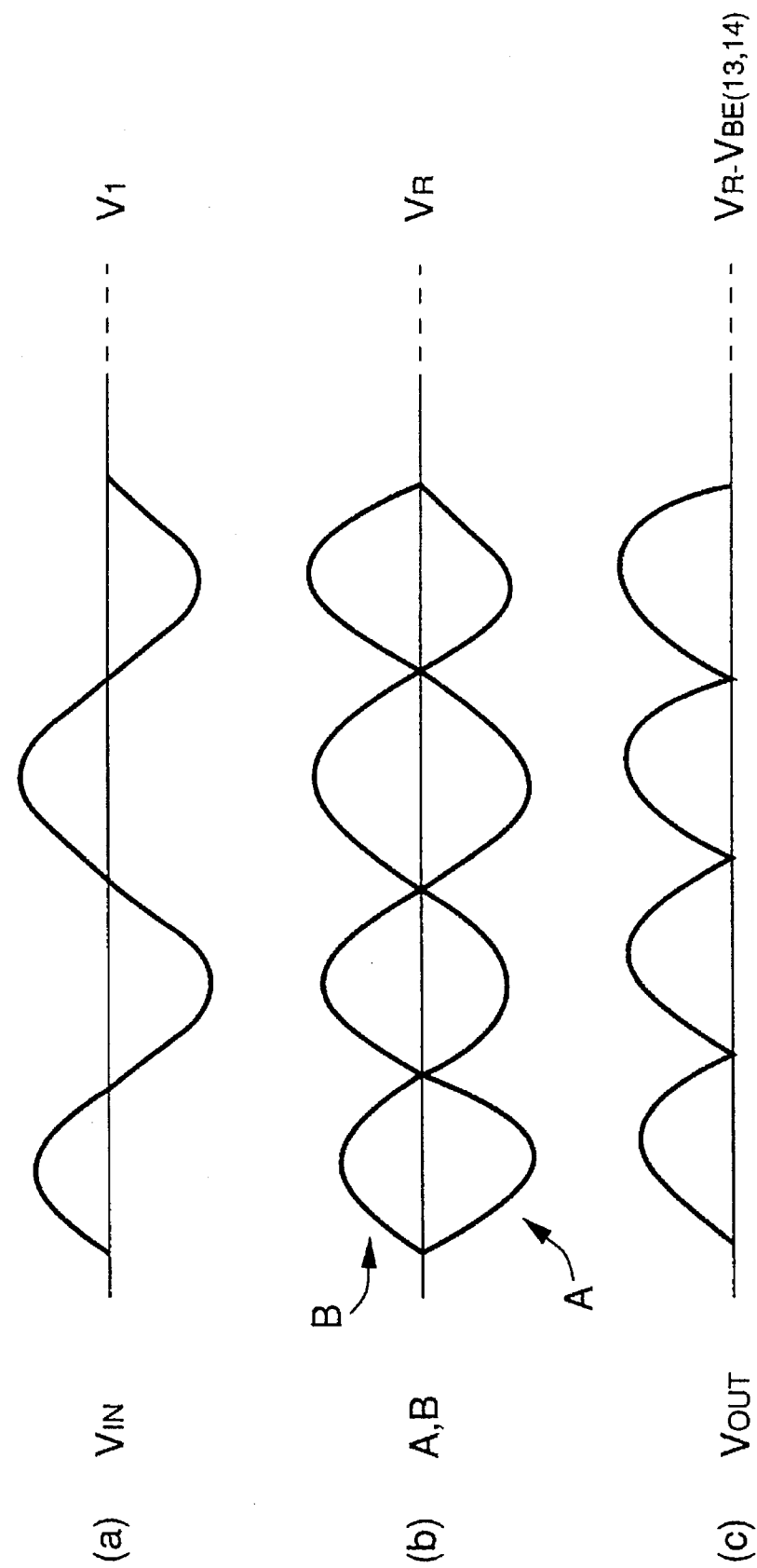
FIG. 2 is a diagram showing a signal waveform at each point in FIG. 1.
Figure 3:
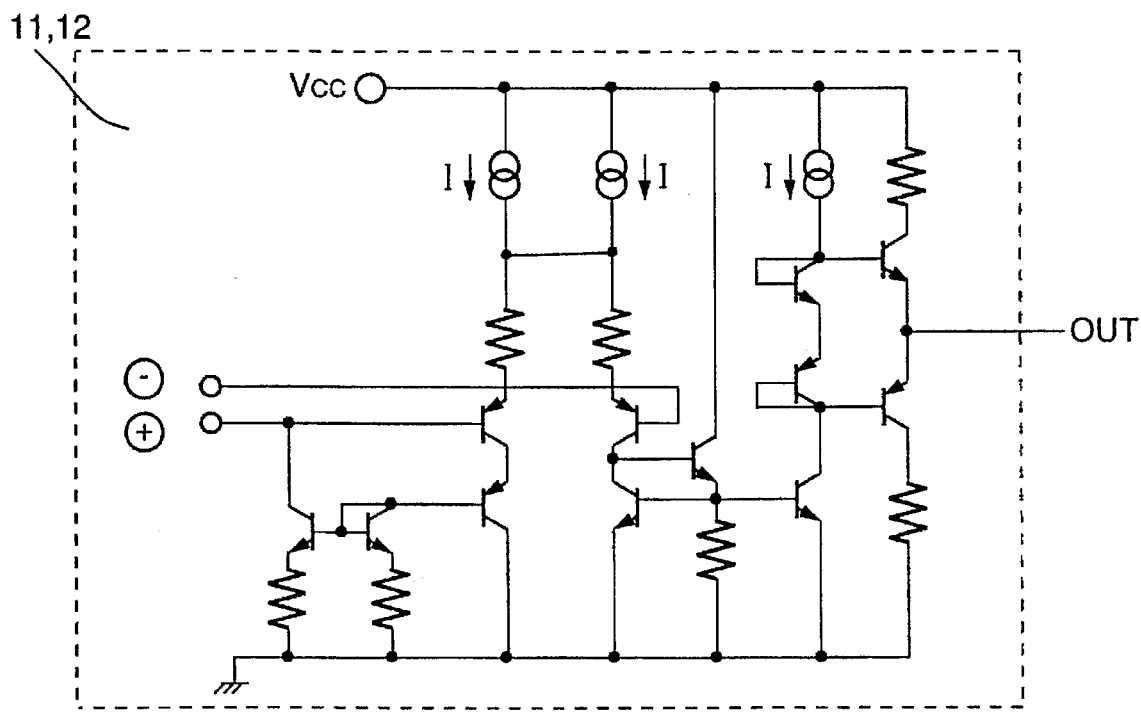
FIG. 3 is a circuit diagram of an inverting amplifier of the conventional signal processing circuit.
Figure 4A:
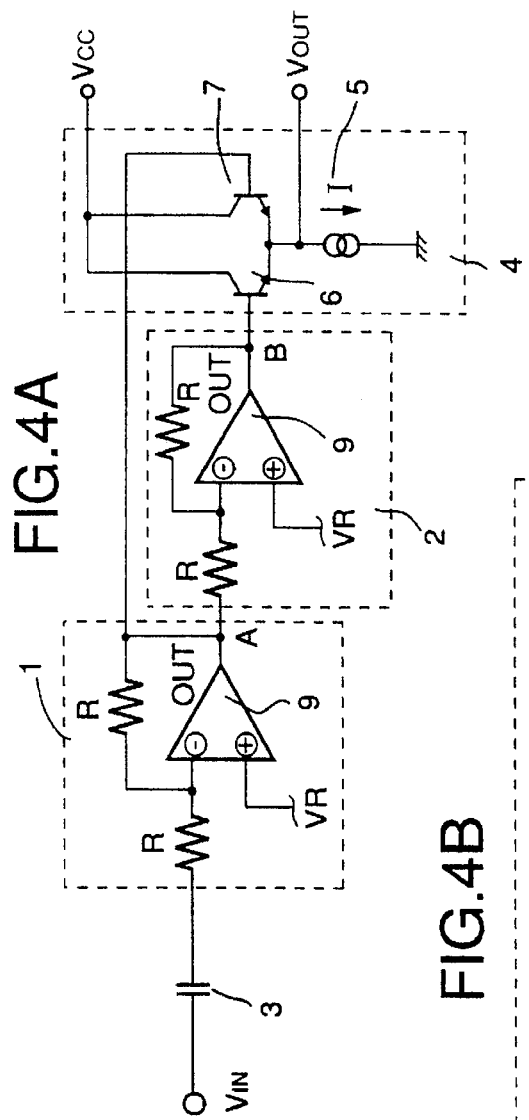
FIGS. 4A and 4B are circuit diagrams of a signal processing circuit according to an embodiment 1 of the invention.
Figure 4B:
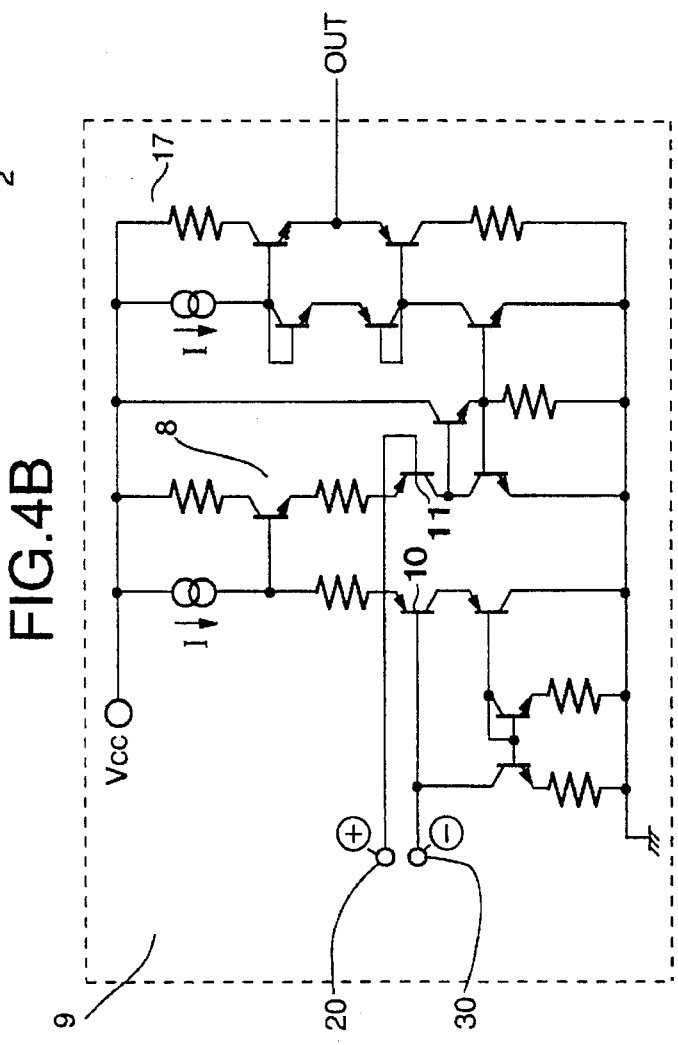

FIGS. 4A and 4B are circuit diagrams showing an embodiment of the invention. In FIG. 4A, reference numerals 1 and 2 denote inverting type amplifiers each of which comprises the resistor R, the reference voltage $V_R$, and an operational amplifier 9. Reference numeral 3 denotes a capacitor element to send the original input signal to the inverting amplifiers by the capacitive coupling; 4 an absolute value detecting circuit which is constructed by commonly connecting emitters as main electrode regions of NPN transistors 6 and 7 and by adding a constant current source 5. FIG. 4B is a circuit diagram showing a practical embodiment of the operational amplifier 9 shown in each of the inverting amplifiers 1 and 2.

Reference numerals 20 and 30 denote an inverting input terminal and a non-inverting input terminal of the operational amplifier and out indicates an output terminal.

The operation of the absolute value detecting circuit will now be described by using an output waveform at each point shown in FIG. 5. Although an input signal which is supplied to an input terminal has an arbitrary voltage level, the DC component of the input signal is cut by the capacitor 3 and only the AC component is transmitted to the post stage. Therefore, the AC component of the input signal is supplied to the inverting amplifier 1 irrespective of the voltage level $V_1$ in FIG. 5. An input offset voltage $V_{BE(8)}$ is applied to the inverting amplifiers 1 and 2 as a voltage corresponding to the base-emitter voltage of each of the NPN transistors (6, 7) by an NPN transistor 8 connected to a collector as a main electrode region of a PNP transistor at the input stage in each of the inverting amplifiers. That is, the output voltage level of each of the inverting amplifiers 1 and 2 is equal to the voltage level which is obtained by adding $V_{BE(8)}$ to the reference voltage $V_R$. Therefore, the output voltage levels at points A and B are fixed to the potential ($V_R+V_{BE(8)}$), respectively. It is well known by one of ordinary skill in the art, when PNP transistors 10 and 11 of FIG. 4B are formed with the same size and equal current flows into them, $V_{BE}(10)$ equals $V_{BE}(11)$, and thus since $V_{OUT}=V_R+V_{BE}(8)+V_{BE}(11)-V_{BE}(10)$, $V_{OUT}=V_R+V_{BE}(8)$.

In the absolute value detecting circuit 4, after that, the potential at point A decreases by a base-emitter voltage $V_{BE(7)}$ as a voltage between the main electrode region and the control electrode region of the NPN transistor 7 and the potential at point B decreases by a base-emitter voltage $V_{BE(6)}$ of the NPN transistor 6. Finally, the output voltage level on the A point side is set to $(V_R+V_{BE(8)}-V_{BE(7)})$ and the output voltage level on the B point side is set to $(V_R+V_{BE(8)}-V_{BE(6)})$. A waveform shown at $V_{out}$ in FIG. 5 is taken out as a final absolute value output signal. In this instance, each of $V_{BE(6)}$ and $V_{BE(7)}$ is a voltage between the base and the emitter of the NPN transistor which is determined by the constant current I. However, by setting $V_{BE(8)}$ of the compensating circuit of each inverting amplifier to the voltages which are equal to $V_{BE(6)}$ and $V_{BE(7)}$, they can be cancelled. It is very difficult to control the absolute value of the base-emitter voltage of the NPN transistor. However, for instance, when it is intended to realize such a circuit by a semiconductor integrated circuit, by making the polarities of the transistors 6, 7, and 8 coincide and by equalizing their sizes (and further by closely arranging those transistors), their base-emitter voltages can be relatively easily equalized. Therefore, the final output voltage level $V_{out}$ is as follows.

$$V_{out}=V_R+V_{BE(8)}-V_{BE(7)}(\text{or } V_{BE(6)})\approx V_R$$

They can be set to the level which is almost equal to $V_R$. The above construction obviously relates to the DC component of the input signal. The function of the absolute value circuit is obviously directly applied with respect to the AC component.
(Embodiment 2)

Figure 6:
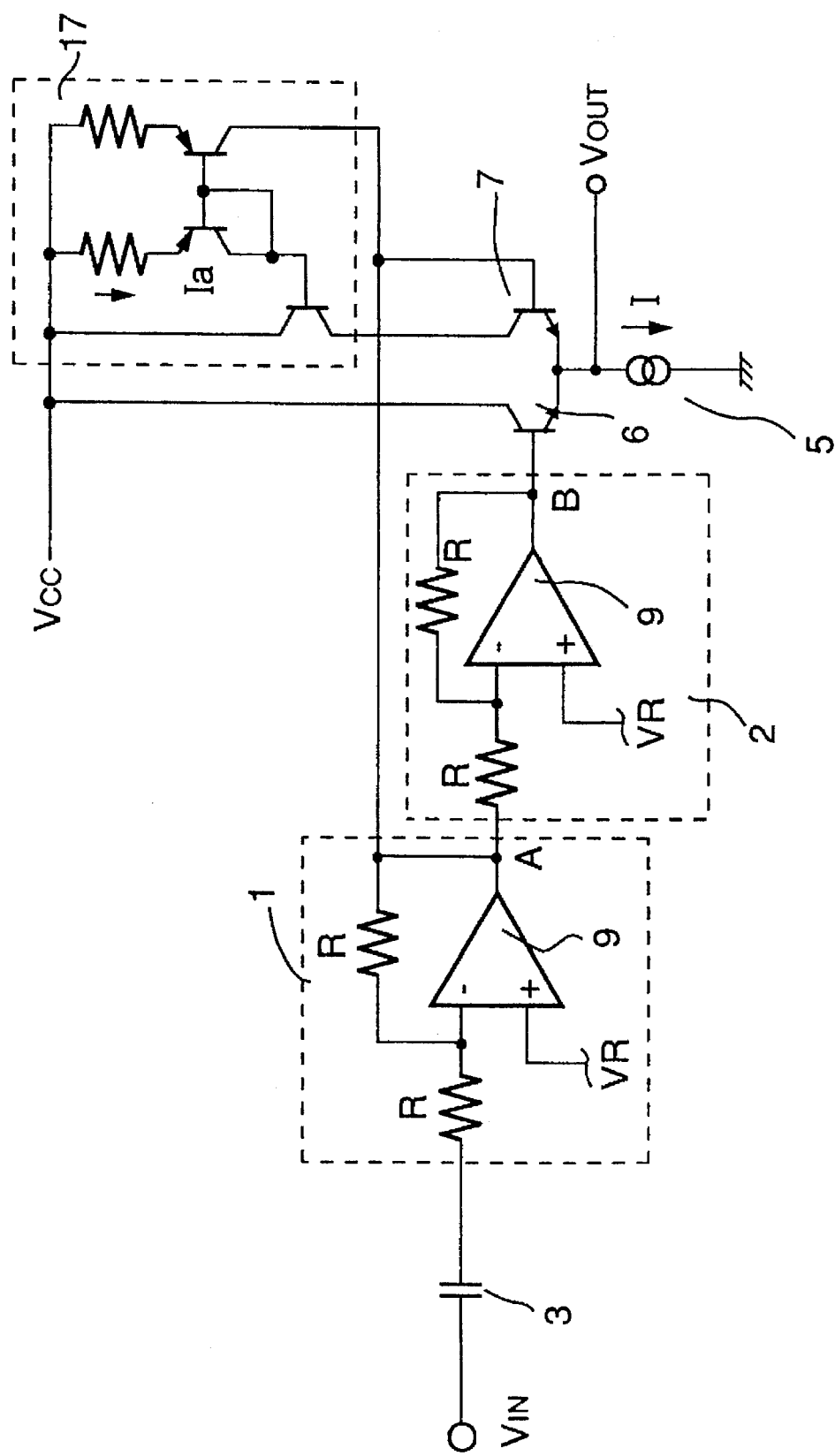
FIG. 6 is a circuit diagram of a signal processing circuit according to an embodiment 2 of the invention.

FIG. 6 shows another embodiment of the invention. In FIG. 6, reference numeral 17 denotes a circuit to cancel a deviation of the voltage level occurring due to a difference between the outputs of the inverting amplifiers 1 and 2. In the absolute value detecting circuit shown in FIG. 4A, when a value of the resistor R to decide a gain of the inverting amplifier is small, a current flowing in the resistor R cannot be ignored. Thus, an offset voltage of a certain extent occurs in the output. Therefore, a difference occurs between the output voltage level at point A where the signal has passed through the inverting amplifier once and the output voltage level at point B where the signal has passed through the inverting amplifier twice. That is, in the foregoing embodiment, there is a case where if the output signal of the inverting amplifier is directly supplied to the absolute value detecting circuit, an accurate output is not obtained in accordance with the use state. Although no problem will ordinarily occur if the value of R is set to an enough large value as a countermeasure, in the case where, for instance, the gain of the inverting amplifier must be set to a large value or the frequency characteristics cause a problem due to the relation with the capacitor 3 because of some reasons, a necessity such that the value of R must be suppressed to a small value occurs. In such a case, by adding the cancelling circuit as shown at reference numeral 17 and by setting a value of current $I_a$ so as to cancel the current to be consumed in the R, even when the value of R is small, a desired absolute value detecting operation can be obtained.

Although only the case of using one kind of inverting amplifier has been shown above for simplicity of explanation, a similar effect can be also obviously derived if any operational amplifier is used.

The above described signal processing circuit can be formed to one chip as a semiconductor integrated circuit. For example, referring to FIG. 7, as a circuit for automatic focusing in a video camera or the like, there is used a signal processing circuit 100 having a construction such that an output signal of a photo-sensor 105 such as a CCD or the like is received and distributed into a high frequency region and a low frequency region, the absolute value of the high frequency region is detected by the circuit (FIG. 4A) in the embodiment 1, and the absolute value of the low frequency region is detected by the circuit (FIG. 6) of the embodiment 2.

Figure 7:
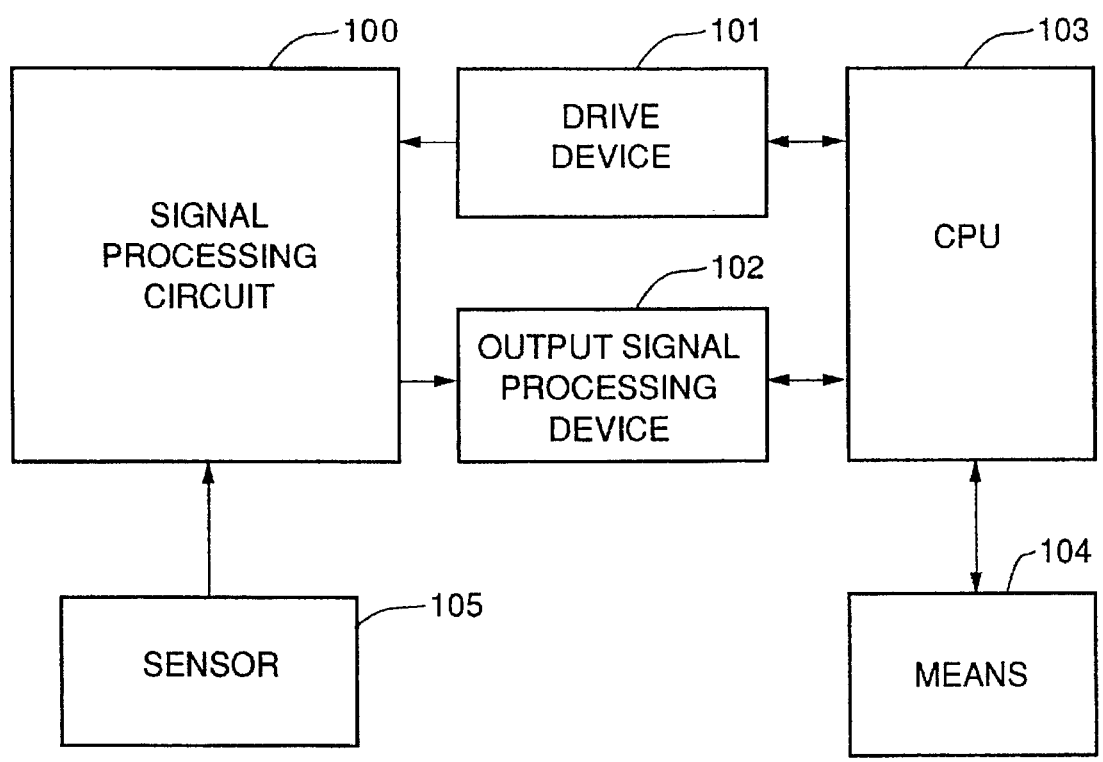
FIG. 7 is a block diagram showing a signal processing system according to the invention.

FIG. 7 shows an example of a signal processing system of the invention mentioned above. Reference numeral 100 denotes the signal processing circuit according to the invention. For instance, a drive device 101 operates by a command from a CPU 103, thereby making the semiconductor device having the signal processing circuit 100 of the invention operative. Thus, the resultant signal is processed by an output signal processing device 102 which is provided as necessary and the processed signal is supplied to the CPU 103. Certain means 104 is driven on the basis of the result of the signal process by the CPU 103. As such means 104, a driving system to actuate an image forming lens as an optical system, or an ink jet recording head, a thermal head, or a magnetic head for a recording apparatus, or the like can be mentioned.

According to the invention as described above, in the signal processing circuit and system for absolute value detection of the type in which the emitters of the transistor are commonly connected, it is possible to cancel the shift of the operating point due to the base-emitter voltage of the transistor. That is, by previously setting the input offset by the compensating circuit for the front stage of the absolute value detecting circuit, the shift of the operating point can be cancelled, the fluctuation of the operating point can be eliminated, a dynamic range can be assured, and the fluctuation by the temperature can be prevented.

What is claimed is:

1. A signal processing circuit for detecting absolute value, comprising:

first and second transistors of which main electrodes are connected commonly;

a first inverting amplifier, an output of which is connected to a control electrode of said first transistor; and a second inverting amplifier, an output of which is connected to a control electrode of said second transistor, said first and second inverting amplifiers being connected serially, an input of said first inverting amplifier being used as an input to said signal processing circuit, and the main electrodes of said first and second transistors being used as an output of said signal processing circuit, wherein said first and second inverting amplifiers have respective input stage transistors of which main electrode regions are connected to a transistor for producing an offset voltage corresponding to a base-emitter voltage of said first and second transistors.

2. A circuit according to claim 1, wherein said signal processing circuit is constructed by a semiconductor integrated circuit.

3. A signal processing system comprising:

first and second transistors of which main electrodes are connected commonly;

a first inverting amplifier, an output of which is connected to a control electrode of said first transistor; and a second inverting amplifier, an output of which is connected to a control electrode of said second transistor, said first and second inverting amplifiers being connected serially, an input of said first inverting amplifier being used as an input to said signal processing system, and the main electrodes of said first and second transistors being used as an output of said signal processing system, wherein the output of said first and second inverting amplifiers is subjected to a level shift, to an extent of a base-emitter voltage of said first and second transistors, by flowing a same current into transistors, of the same sizes as said first and second transistors, provided within said first and second inverting amplifiers, said first and second inverting amplifiers having respective input stage transistors of which main electrode regions are connected to a transistor for producing an offset voltage corresponding to a base-emitter voltage of said first and second transistors.

4. A signal processing system comprising:

a signal processing circuit according to claim 1; and a CPU to control said signal processing circuit.

5. A system according to claim 3, wherein said system processes a signal generated from an external sensor.

6. A signal processing system comprising a signal processing circuit according to claim 1, wherein said system drives external means on the basis of a signal generated from said signal processing circuit.

* * * * *

UNITED STATES PATENT AND TRADEMARK OFFICE
CERTIFICATE OF CORRECTION

PATENT NO. : 5,642,070

DATED : June 24, 1997

INVENTOR(S): TATSUO FURUKAWA

It is certified that error appears in the above-identified patent and that said Letters Patent is hereby corrected as shown below:

On the title page:

[56] REFERENCES CITED

Foreign Patent Documents
"2079608" should read --2-079608--.

COLUMN 5

Line 26, "circuitaccording" should read
--circuit according--.

Signed and Sealed this

Sixth Day of January, 1998

Attest:

BRUCE LEHMAN

Attesting Officer

Commissioner of Patents and Trademarks